United States Patent
Co

(10) Patent No.: US 6,742,144 B2
(45) Date of Patent: *May 25, 2004

(54) LOCAL HEATING OF MEMORY MODULES TESTED ON A MULTI-MOTHERBOARD TESTER

(75) Inventor: Ramon S. Co, Trabuco Canyon, CA (US)

(73) Assignee: Kingston Technology Co., Fountain Valley, CA (US)

(*) Notice: Subject to any disclaimer, the term of this patent is extended or adjusted under 35 U.S.C. 154(b) by 264 days.

This patent is subject to a terminal disclaimer.

(21) Appl. No.: 09/683,525

(22) Filed: Jan. 14, 2002

(65) Prior Publication Data

US 2002/0056057 A1 May 9, 2002

Related U.S. Application Data

(63) Continuation-in-part of application No. 09/702,017, filed on Oct. 30, 2000, which is a continuation-in-part of application No. 09/660,714, filed on Sep. 13, 2000.

(51) Int. Cl.[7] ................................................. H02H 3/05
(52) U.S. Cl. .......................................... 714/42; 714/718
(58) Field of Search .............................. 714/42, 29, 54, 714/718, 767; 324/760, 158.1

(56) References Cited

U.S. PATENT DOCUMENTS

| | | | |
|---|---|---|---|
| 4,145,620 A | 3/1979 | Dice ........................... 307/149 |
| 4,212,629 A | 7/1980 | Nagasaka et al. .............. 432/10 |
| 5,078,592 A | 1/1992 | Grimshaw et al. ............. 432/59 |
| 5,103,168 A | 4/1992 | Fuoco ........................ 324/158 |
| 5,515,910 A | 5/1996 | Hamilton et al. .............. 165/30 |
| 5,543,727 A | * 8/1996 | Bushard et al. .............. 324/760 |
| 5,852,617 A | 12/1998 | Mote, Jr. .................. 371/22.31 |
| 5,954,205 A | * 9/1999 | Smith ............................. 209/2 |
| 6,023,412 A | 2/2000 | Morita ........................ 361/690 |
| 6,046,421 A | * 4/2000 | Ho .............................. 209/573 |
| 6,097,200 A | 8/2000 | Turlapaty et al. ............ 324/760 |
| 6,114,868 A | * 9/2000 | Nevill ......................... 324/760 |
| 6,154,042 A | * 11/2000 | Nevill ......................... 324/760 |
| 6,285,962 B1 | 9/2001 | Hunter ........................ 702/117 |
| 6,304,442 B1 | 10/2001 | Tucker et al. ............... 361/695 |
| 6,357,023 B1 | * 3/2002 | Co et al. ....................... 714/42 |
| 6,415,397 B1 | * 7/2002 | Co et al. ....................... 714/42 |

* cited by examiner

Primary Examiner—Dieu-Minh Le
(74) Attorney, Agent, or Firm—Stuart T. Auvinen

(57) ABSTRACT

A test system has many motherboards. Each motherboard has a reverse-mounted test adaptor board that contains a test socket. A robotic arm inserts a memory module into the test socket, allowing the motherboard to execute programs to test the memory module. A test chamber surrounds the test socket. Compressed air is regulated and routed to local heaters near each motherboard. The local heaters pass the air over a resistive heating element to heat the air. The heated air is then directed into the test chamber to heat the memory module being tested. A local valve controls the air flow through the local heater. A host computer receives temperature measurements from each test chamber and adjusts the local heater and valve to maintain a desired test temperature. The motherboards can be cooled by cooling fans while the memory modules being tested are heated.

20 Claims, 6 Drawing Sheets

LOCAL HEATING OF MEMORY MODULES TESTED ON A MULTI-MOTHERBOARD TESTER

CROSS REFERENCE TO RELATED APPLICATIONS

This application is a continuation-in-part of the co-pending applications for Automated Multi-PC-Motherboard Memory-Module Test System with Robotic Handler and In-Transit Visual Inspection, U.S. Ser. No. 09/660,714, filed Sep. 13, 2000 and "Connector Assembly for Testing Memory Modules from the Solder-Side of a PC Motherboard with Forced Hot Air", U.S. Ser. No. 09/702,017, filed Oct. 30, 2000.

BACKGROUND OF INVENTION

This invention relates to elevated-temperature electronic-test systems, and more particularly to robotic testers for memory modules including SIMMs and DIMMs.

A variety of electronic systems including personal computers (PCs) use DRAM memory chips mounted on small, removable memory modules. Older single-inline memory modules (SIMMs) have been replaced with dual-inline memory modules (DIMMs), and 184-pin RIMMs (Rambus inline memory modules) and 184-pin DDR (double data rate) DIMMs. New kinds of memory modules continue to be introduced.

The memory-module industry is quite cost sensitive. Testing costs are significant, especially for higher-density modules. Specialized, high-speed electronic test equipment is expensive, and the greater number of memory cells on high-speed memory modules increases the time spent on the tester, increasing test costs.

Handlers for integrated circuits (ICs) have been used for many years in the semiconductor industry. Handlers accept a stack of IC chips that are fed, one at a time, to the tester. The tested IC is then sorted into a bin for IC chips that have passed or failed the test. Handlers have also been developed for memory modules.

Rather than use an expensive general-purpose I.C. tester, inexpensive testers based on PC motherboards have been developed. These motherboard-based testers cost only about $10 K while replacing a quarter-million-dollar I.C. tester. The memory module to be tested is inserted into a test socket on a test adapter board (daughter card) mounted on the back-side of the motherboard. Special handlers can be used for module insertion.

Elevated-temperature testing is often desired to more thoroughly screen for defects. Hot air can be blown onto the memory module being tested. Ideally, the motherboard itself is cooled while the memory module under test is heated. See the parent application, "Connector Assembly for Testing Memory Modules from the Solder-Side of a PC Motherboard with Forced Hot Air", U.S. Ser. No. 09/702,017, now U.S. Pat. No. 6,357,023.

FIG. 1 highlights funneling hot air to the memory module being tested, while the motherboard inside a chassis is cooled. A conventional PC motherboard is mounted upside-down within chassis 60. Rather than connect motherboard substrate 30 directly to chassis 60, as in a conventional PC, motherboard substrate 30 is mounted to metal plate 64 by standoffs or spacers 61. Motherboard substrate 30 is not mounted directly to chassis 60 in this embodiment, although it could be in some embodiments. Screws, bolts, or clamps (not shown) can be used to secure metal plate 64 to chassis 60.

Test adapter board 50 is mounted to well 66, while well 66 is mounted to metal plate 64. Test socket 51 is mounted to test adapter board 50, while pins 52 provide electrical connection from test socket 51 to motherboard substrate 30. The memory module 18 being tested is inserted into test socket 51. Test adaptor board 50 provides electrical connection from the module-under-test (MUT) in the SIMM/DIMM test socket 51 to the leads for the removed SIMM socket on the PC motherboard.

Motherboard substrate 30 has components 42, 44 (I.C. chips, sockets, capacitors, etc.) mounted on component-side 32 of substrate 30. Memory modules 36 are SIMM or DIMM modules that fit into SIMM/DIMM sockets 38. SIMM/DIMM sockets 38 (hereinafter SIMM sockets 38) have metal pins that fit through holes in substrate 30. Expansion cards 46 are plugged into expansion sockets that are also mounted onto component-side 32 of substrate 30. Cables 48 and expansion cards 46 are bulky but do not interfere with a robotic arm inserting memory module 18 into test socket 51 since cables 48 and expansion cards 46 are mounted below substrate 30, while test socket 51 is mounted above substrate 30. Cables 48 and expansion cards 46 are kept out of the way inside chassis 60.

Test adapter board 50 is a small circuit board that allows an automated handler, a person, or a robotic arm easy access to SIMM/DIMM test socket 51 that is mounted on test adaptor board 50. Test socket 51 on one surface of test adapter board 50 mates with connectors on SIMM/DIMM memory module 18, the module-under test. The other surface of adaptor board 50 has adapter pins 52 inserted in holes to make electrical contact. These adaptor pins are soldered into through-holes in adaptor board 50 and in substrate 30. Adapter pins 52 are arranged to have the same arrangement and spacing as the substrate-mounting pins for SIMM sockets 38. One or more of SIMM sockets 38 has been removed from the component side of the PC motherboard, leaving the through-holes. Adapter pins 52 are then fitted through the exposed through holes for the removed SIMM socket. Rather than push the pins through from component-side 32, adapter pins 52 are pushed through from solder-side 34 to component-side 32.

Top plate 75 can be mounted to chassis 60 in a variety of ways, such as by standoffs or metal guides or brackets. Top plate 75 has an opening to allow access to test socket 51 so that a robotic arm can insert and remove memory module 18 from test socket 51.

When environmental testing is desired, heated air is forced between top plate 75 and metal plate 64. This heated air blows past memory module 18 when it is inserted into test socket 51. The heated air warms memory module 18 to an elevated temperature. When memory module 18 is heated, it is typically more likely to fail than when at room temperature. Such elevated-temperature testing provides a margin or guard-band to the test, so that the passing memory modules are more reliable than modules tested at room temperature.

Cooling fan 71 is provided in chassis 60 to cool motherboard substrate 30 and its components 42, 44 and expansion cards 46. Even air at room temperature can be effective at cooling the motherboard if a sufficient volume of air is blown past the motherboard's components. Components such as integrated circuits heat up during operation and benefit from such cooling. Of course, reduced-temperature air could also be blown into chassis 60, such as air from outside a building in a cold climate.

Since metal plate 64 separates motherboard substrate 30 from test adapter board 50, the cooling air from cooling fan 71 is separated from the heated air blown against memory module 18 under test. Test adapter board 50 is mounted within well 66 and forms a sufficient seal to prevent the cooling air within chassis 60 from cooling memory module 18 being heated and tested.

Top plate 75 can be replaced with a tube, rectangular pipe, or air guide that blows hot air directly on memory module 18. This may provide a more efficient air flow. Temperature sensors such as thermocouples could be added near the test socket. Chassis 60 can be provided with slots, holes and openings to allow for air flow to motherboard components 42, 44 and expansion cards 46. Multiple cooling fans can be used.

A larger chassis with multiple openings on the top, each for holding a metal plate 64 with a motherboard and test adapter board can be used. This allows for parallel testing using several motherboards and test sockets.

FIG. 2 is an overhead diagram looking down on a multi-motherboard test station with overhead rails for an x-y-z robotic handler. See the parent application, Automated Multi-PC-Motherboard Memory-Module Test System with Robotic Handler and In-Transit Visual Inspection, U.S. Ser. No. 09/660,714. Operator 100 can sit in front of the test station, controlling operation with a touch-screen or keyboard. Trays of untested memory modules can include a barcode that is scanned in to main system interface 65 by operator 100 before the tray is put into input stacker 63. Robotic handler 80 then picks untested modules that are moved over to input tray 62 by stacker 63. The modules are first inserted into leakage tester 82. Modules that pass are then moved by robotic handler 80 to the test socket on the test adaptor board on the solder-side of one of motherboard substrates 30 for testing.

Modules that fail the motherboard or leakage test are placed on repair tray 76 by robotic handler 80. Modules passing the motherboard test are pulled from the test socket by robotic handler 80 and moved in front of cameras 75 for visual inspection. Modules failing visual inspection are dropped into VI tray 78. Passing modules are placed on output tray 72 and full trays are moved by stacker 73 to the front of the test station where operator 100 can remove them.

Each of the motherboards fits into a well in the frame of the test station. The test station has a surface at about bench-top level composed of the exposed solder sides of the motherboards in the wells in the frame. Robotic handler 80 rides on rails 92, 94 mounted above the level of the motherboards, such as above the head of a seated operator 100. Operator 100 also replaces repair tray 76 and VI tray 78 with empty trays when full.

Fixed rails 92, 94 in the x direction allow movable y-rail 96 to travel in the x direction. Robot arm assembly 98 then travels in the y direction along y-rail 96 until robot arm assembly 98 is directly over the desired position, such as a test socket on an adaptor board, or an input or output tray. An elevator arm on robot arm assembly 98 then moves up and down, pulling out (up) a module or inserting a module into (down) a test socket or tray. Robot arm assembly 98 can also rotate or spin the module into the desired position.

What is desired is a heating system for a multiple-motherboard robotic test system. A method of heating memory modules being tested in a robotic tester is desired. Good temperature control is desirable.

DETAILED DESCRIPTION

The present invention relates to an improvement in elevated-temperature robotic memory-module testers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
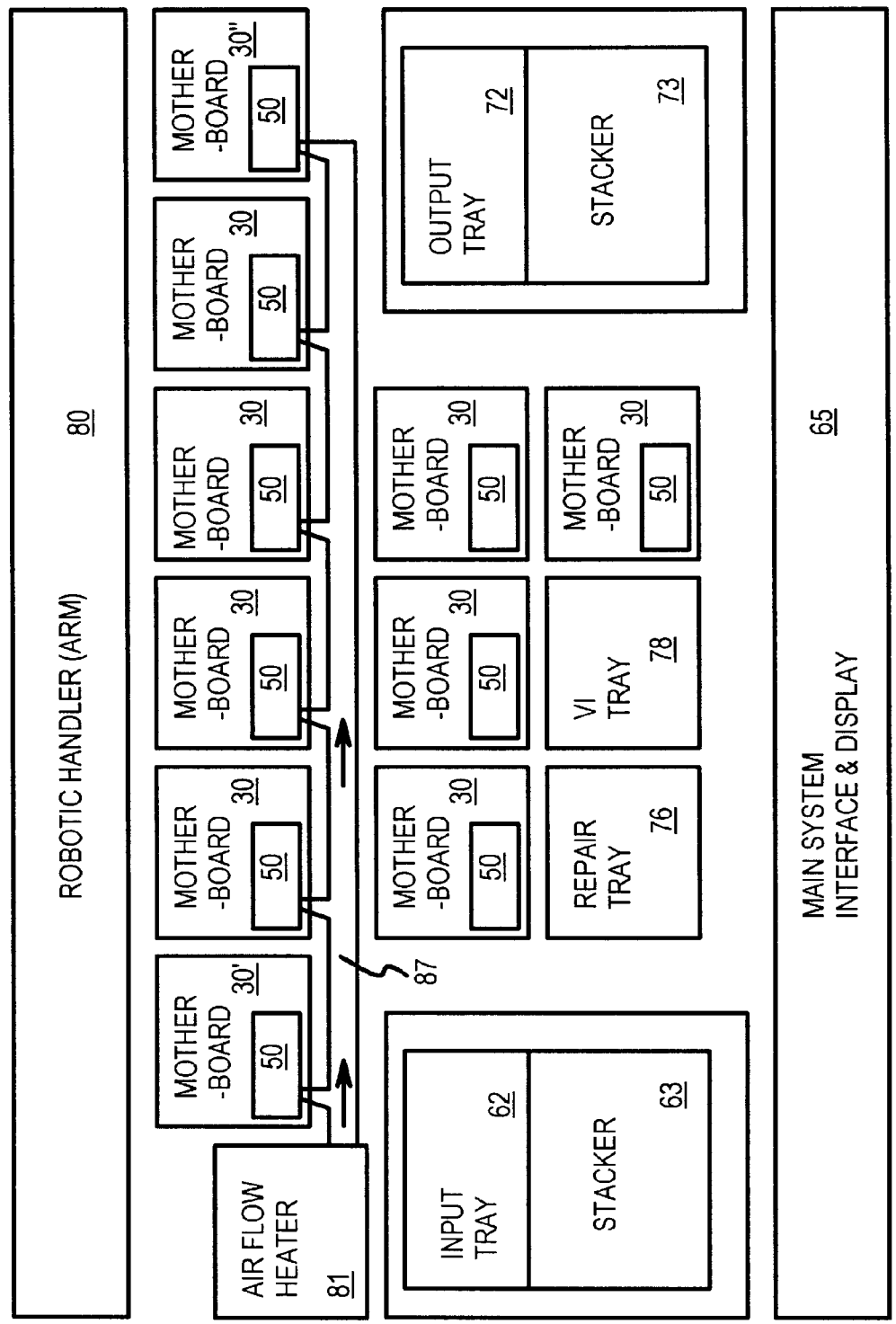
FIG. 3 is a diagram of hot-air distribution in a multi-motherboard test system.

FIG. 3—Distributed Hot Air Produces Non-uniform Heating

FIG. 3 is a diagram of hot-air distribution in a multi-motherboard test system.

A total of 10 motherboards are fitted into the frame of the test station. Each motherboard substrate 30 has its solder-side facing up, hiding the expansion cards, cables, and components underneath the test-station frame. Each motherboard has a test adaptor board 50 mounted on the solder-side of substrate 30. Each test adaptor board has at least one test socket that can receive a memory module that is inserted by robotic handler 80.

Air-flow heater 81 blows heated air into heating duct 87 which directs the hot air to test adaptor boards 50 of the various motherboards. The hot air from heating duct 87 directs the heated air onto the memory modules being tested. Tubes rather than ducts can be used for heating duct 87.

However, the heated air tends to cool somewhat as it is distributed to the various motherboards. In particular, remote motherboards such as last motherboard substrate 30" have noticeably cooler air blowing from heating duct 87 than does first motherboard substrate 30'. Thus temperatures vary for memory modules inserted into test adaptor boards 50 during testing. The non-uniform temperatures on different motherboards can hinder test uniformity.

The inventor has realized that such distribution of heated air from a central source results in non-uniform temperatures. Simply blowing hot air across several motherboards in a large tester does not yield precise temperature control. More precise temperature control can be obtained by locally heating the air next to each test adaptor board 50.

Figure 4:
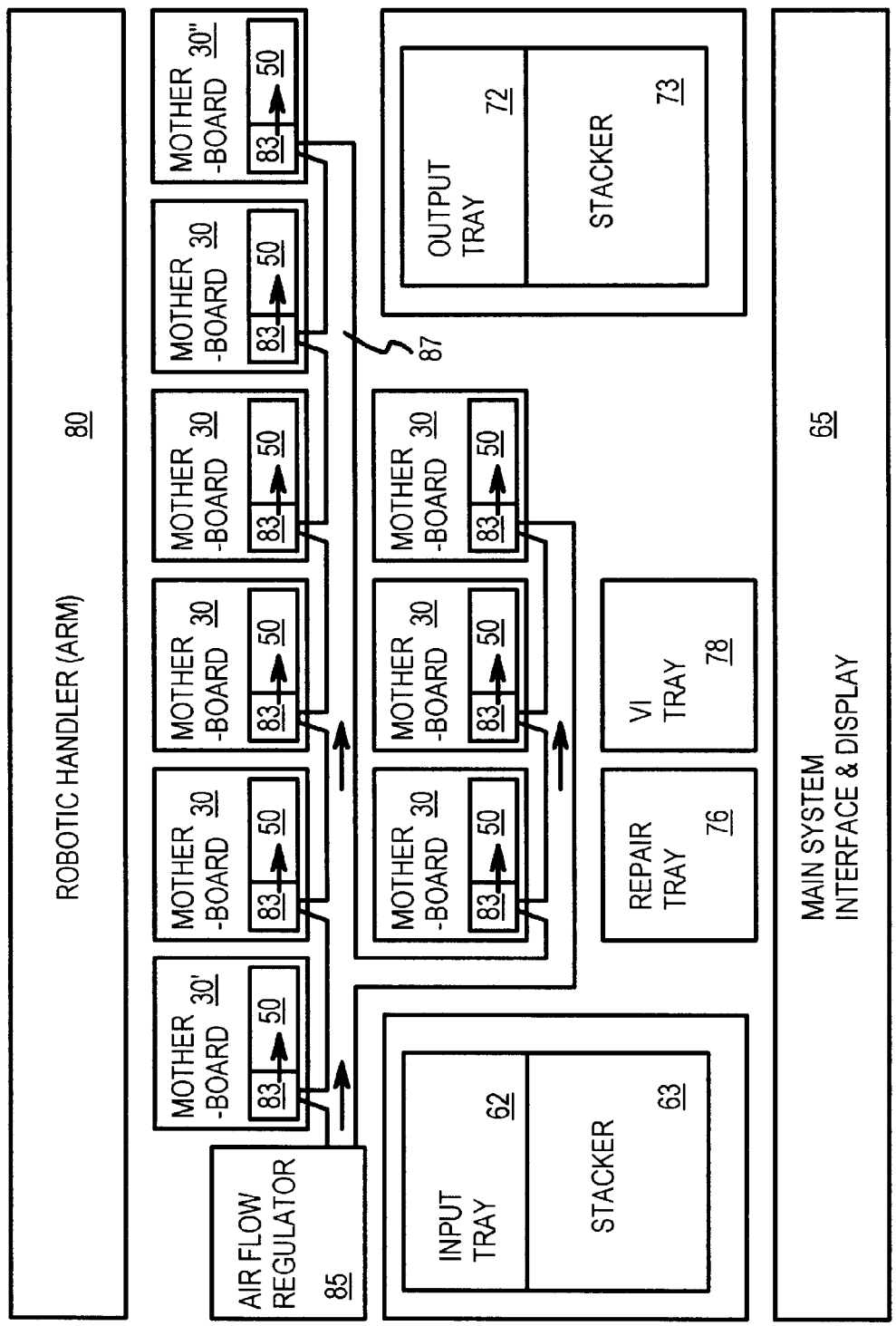
FIG. 4 highlights local heating of air blown onto memory modules being tested by a multi-motherboard robotic tester.

FIG. 4—Local Heaters for each Motherboard Tester

FIG. 4 highlights local heating of air blown onto memory modules being tested by a multi-motherboard robotic tester. Air flow regulator 85 blows air into air duct 87. Air flow regulator 85 can receive compressed air from a supply line in a factory. This air can be somewhat heated by the compressor pumps and by air flow regulator 85, but in general is not heated to the desired test temperature.

Local heaters 83 are located on the mounting plates that hold each motherboard substrate 30. Each local heater 83 receives part of the compressed air flow from air duct 87 and directs the air flow to a memory module inserted into the test socket on test adaptor board 50. An electrical heating element in local heater 83 heats the air flowing through to the desired temperature just before the air impinges upon the memory module being tested. Thus the air is heated to the desired temperature at each local heater 83 on each motherboard substrate 30.

Since the air is heated locally on each motherboard substrate 30 by local heaters 83, uniform temperatures can be maintained on different test adaptor boards 50. For example, the air-flow temperature for modules tested by last motherboard substrate 30" can be about the same as the air-flow temperature for modules tested by first motherboard substrate 30', even though they are located on opposite ends of air duct 87.

Robotic handler 80 inserts and removes memory modules from the test sockets on test adaptor boards 50 without damage to the modules or the test sockets. Motherboard substrates 30 have holes drilled in them for mounting to a frame of the test station using bolts. Motherboards typically have several sets of mounting holes to allow the same motherboard to be used in different kinds of PC chassis. The frame of the test station is designed to use these mounting holes to hold the motherboards upside-down at roughly bench-top level at the test station.

Main system interface 65 contains a host computer system with an interface to the operator such as a display and a keyboard or bar-code reader. Main system interface 65 controls robotic handler 80 and commands motherboard substrates 30 to begin tests on inserted memory modules. The test results are communicated back to main system interface 65, which instructs robotic handler 80 to move the tested module from the motherboards.

Main system interface 65 can also control local heaters 83 and receive temperature measurements from thermocouples mounted near each test adaptor board 50. Temperature-control algorithms can be executed by main system interface 65 to adjust temperatures at each test adaptor board 50. Different motherboards could test at different temperatures if desired.

Trays full of untested memory modules are loaded into stacker 63 in a stack. The tray at the top of the stack is exposed to robotic handler 80, which removes modules from the top tray of input tray 62 for testing by the motherboards. Once the top tray is emptied of modules, the top tray is pushed down to a second stack of empty trays.

A new full tray from stacker 63 is slid from the top of the full stack to the top of the empty stack, allowing robotic handler 80 to continuously remove memory modules.

The empty trays from input stacker 63 are moved over to output stacker 73 by the operator. Output tray 72 likewise operates with stacker 73, pushing empty trays up one stack until exposed to robotic handler 80, which fills the empty trays with tested memory modules. Once a tray is filled, it is pushed down the full stack until the operator removes the full trays.

Once a motherboard has finished testing a module, robotic handler 80 picks the module from the test socket on its test adaptor board 50 and moves the module to a visual inspection position. Modules failing the visual test are placed in VI tray 78, while modules passing both the visual and motherboard-functional test are placed on output tray 72. Modules that fail the motherboard functional test are placed on repair tray 76.

Figure 5:
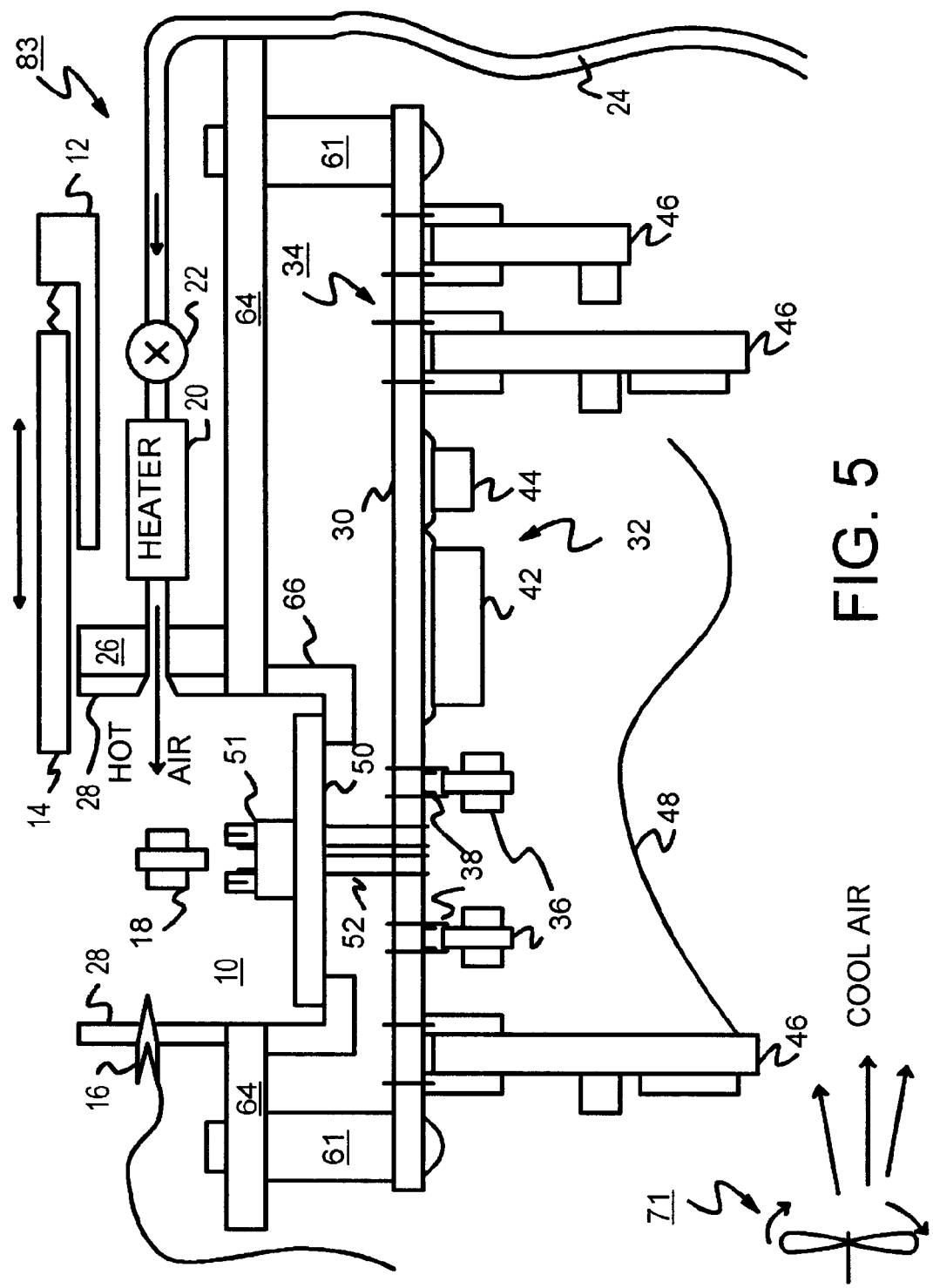
FIG. 5 is a more detailed side view of a local heater and test adaptor board mounted to a motherboard.

FIG. 5—Side View of Local Heater and Motherboard

Figure 1:
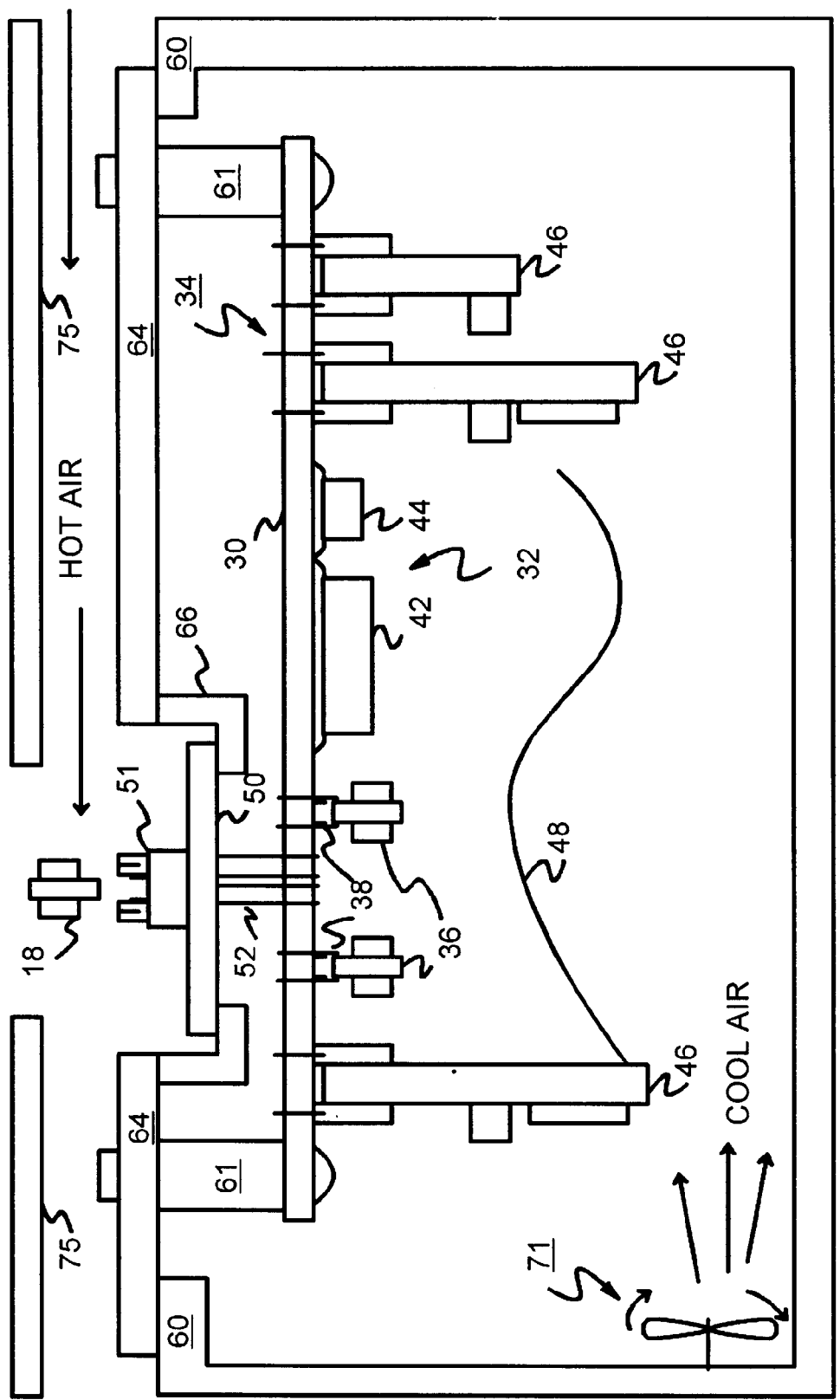
FIG. 1 highlights funneling hot air to the memory module being tested, while the motherboard inside a chassis is cooled.
Figure 2:
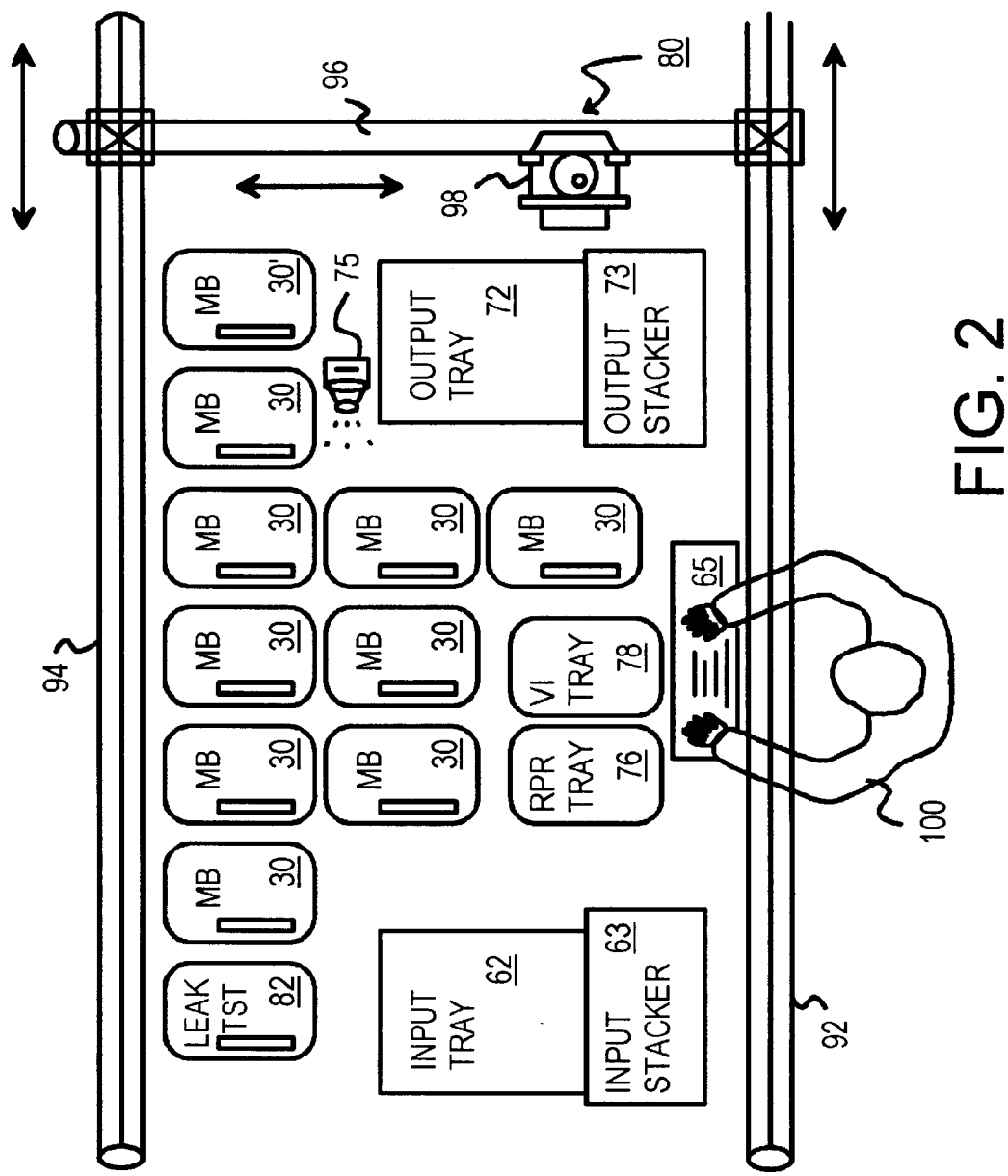
FIG. 2 is an overhead diagram looking down on a multi-motherboard test station with overhead rails for an x-y-z robotic handler.

FIG. 5 is a more detailed side view of a local heater and test adaptor board mounted to a motherboard. Motherboard substrate 30 is mounted upside-down to metal plate 64 using bolts and spacers 61. The various motherboard components are as described earlier for FIG. 1. Cooling fan 71 allows the motherboard to be cooled while test adaptor board 50 is heated. Many cooling fans can be mounted on the sides of the tester to draw air past all motherboards mounted on the tester, rather than have separate cooling fans for each motherboard.

Metal plate 64 can have a fiberglass board mounted on top of it (not shown) to better insulate motherboard substrate 30. Alternately, a rigid fiberglass board can replace metal plate 64. Well 66 can be a part of this board, or can be a separate metal or fiberglass or other molded fitting that connects metal plate 64 to test adaptor board 50. Alternately, well 66 may be eliminated and a gap left between metal plate 64 and test adaptor board 50, since test adaptor board 50 is mounted to motherboard substrate 30 by pins 52 and could be supported by pins 52. In some embodiments test adaptor board 50 may be above metal plate 64 rather than below it as shown. The metal plate may be extended, reducing the size of the opening, to allow the test adaptor board to rest on the metal plate for support. Thus the metal plate can function as the well in this alternative embodiment.

Memory module 18 being tested is inserted into test socket 51 mounted on test adaptor board 50. Hot air is blown onto memory module 18 during testing. A test chamber 10 is formed around test socket 51 by side wall 28 which surrounds test chamber 10. Cover 14 can be slid over the top opening of test chamber 10 to close test chamber 10 during testing, allowing the temperature around memory module 18 to be better controlled. Cover 14 can then be slid open by cover motor 12 to allow the robotic arm to remove memory module 18 after testing is complete.

Compressed air from the air duct or other tubing (not shown) is delivered through inlet tube 24 to valve 22 of local heater 83. Valve 22 can open and close to control the local air flow. Air that is allowed through valve 22 is heated by passing over an electrically-heated heating element in heater 20. The heated air from heater 20 then passes through a passage inside end block 26 and through a hole in side wall 28 and is expelled into test chamber 10.

The temperature of test chamber 10 is measured by thermocouple 16, which is mounted through a hole in side wall 28. Other kinds of temperature measurement devices could be substituted. Valve 22 could be mounted under metal plate 64 or along inlet tube 24. A cluster of valves for many motherboards could be mounted on the outside of the tester near the compressed-air regulator.

Figure 6:
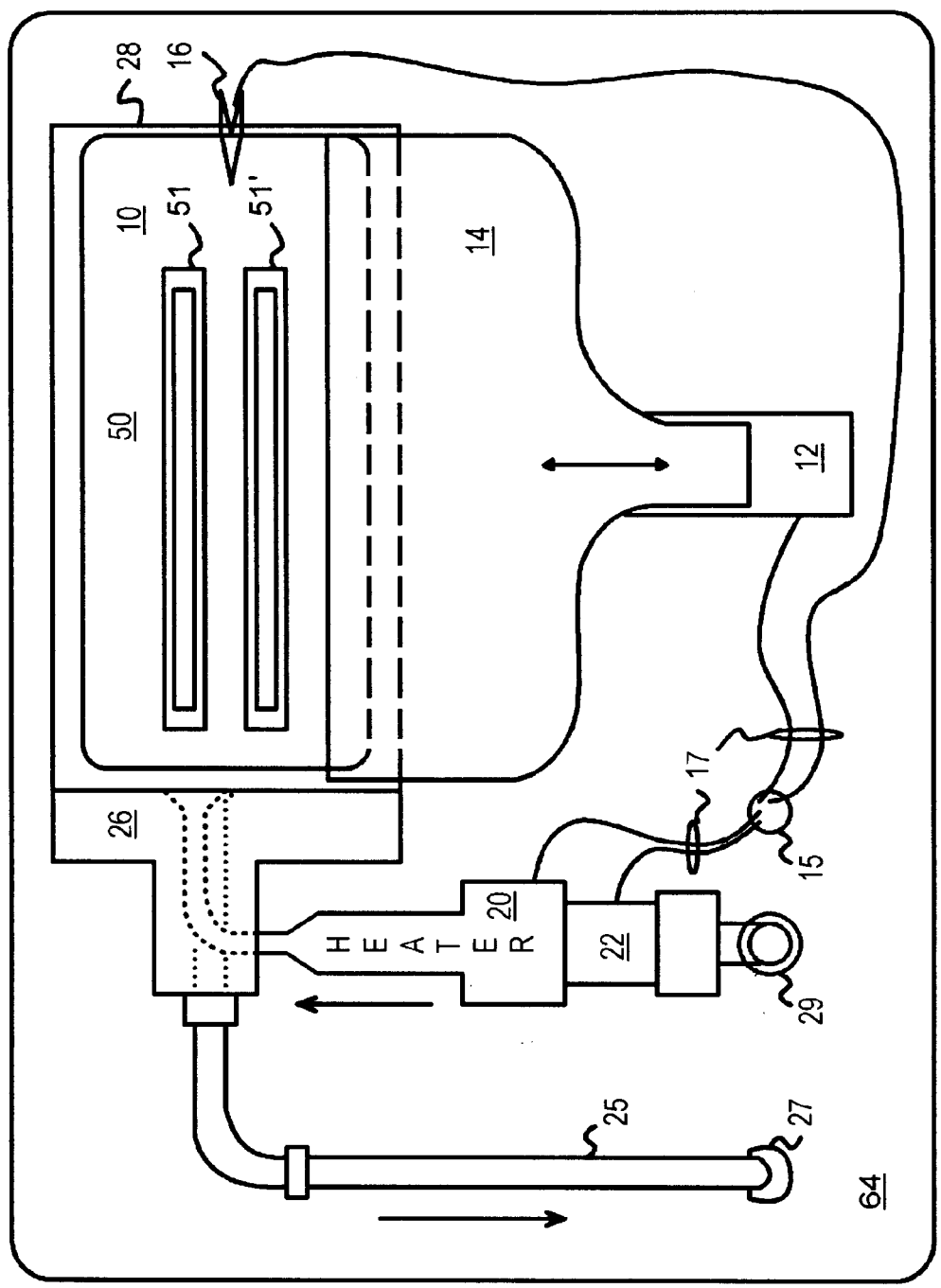
FIG. 6 is an overhead view of the local heater and test chamber mounted on the top of a metal plate that has a motherboard mounted underneath.

FIG. 6—Overhead View of Local Heater and Test Chamber

FIG. 6 is an overhead view of the local heater and test chamber mounted on the top of a metal plate that has a motherboard mounted underneath. In this embodiment test chamber 10 has two test sockets 51, allowing two memory modules to be inserted by a robotic arm and tested at the same time by the same motherboard. Side wall 28 surrounds test chamber 10 and sits above test adaptor board 50 which has test sockets 51 mounted on its top surface.

Cover 14 can be slid over the top opening of test chamber 10 to seal the chamber and better maintain the elevated temperature inside test chamber 10. Cover motor 12 moves cover 14 along a track until cover 14 reaches the far end of side wall 28 (the long upper side of side wall 28 the FIG.).

Cover 14 is shown in the open position, which allows the robotic arm to insert and remove memory modules from test sockets 51.

Air flow from the inlet tube reaches valve 22 through various tubes and fittings that pass through hole 29 in metal plate 64. Valve 22 regulates the air flowing through to heater 20. Heater 20 has a resistive heating element that becomes hot when an electric current passes through. Air flowing past this resistive heating element in heater 20 is heated to a temperature slightly above the desired test temperature. The heated air from heater 20 then passes through an interior passage or bore in end block 26. The interior passage directs the heated air into test chamber 10. Ideally, this heated air is blown against any memory modules inserted into test sockets 51.

End block 26 is itself heated by passage of the heated air from heater 20. End block 26 acts as a thermal mass, helping to maintain a stable temperature for test chamber 10. To relieve the pressure buildup in test chamber 10, a second passage or bore in end block 26 allows air to escape from test chamber 10. This exiting air is directed out exit tube 25 and through hole 27 in metal plate 64 to ducting or tubes that direct the exhaust air away from the tester. This prevents the motherboards from being heated by the warm exhaust air.

I/O Card on Host

Thermocouple 16 measures the temperature inside test chamber 10. Wires 17 pass through hole 15 in metal plate 64 and are connected to an I/O card on a host computer, such as main system interface 65. The I/O card allows the computer to read the voltage representing the temperature of thermocouple 16. The I/O card also has registers or voltage generators that can be written by programs executing on the host. These registers drive wires 17 that activate cover motor 12, valve 22, and heater 20. Thus the host computer can read the temperature, and adjust the heater and valve to compensate. The host can also open and close cover 14.

There are several procedures that the host computer can execute to regulate the temperature of test chamber 10. One procedure is to keep valve 22 open but to adjust the amount of current through the resistive element in heater 20. The I/O card can have a digital-to-analog converter (DAC) to more precisely control the amount of current. Another procedure is to set the heater to a fixed high temperature while varying the air flow through valve 22. Valve 22 can be closed when the temperature measured is above the set point, and opened when the temperature is too low.

Alternately, a combination of these two procedures can be used where both the heater and valve are adjusted. When the measured temperature is above the desired temperature, the valve is closed and the heater is turned off or its current is reduced. As the temperature falls below the desired temperature, the valve is opened again and the heater is turned on or its current increased. The heater and/or valve could simply be turned on to a preset setting and turned off rather than being adjusted over a range. Various more complex second and third order control loops can be implemented as well.

The I/O card can receive wires separately from each motherboard tester in the test system. The host computer can monitor the temperature of all motherboard's test chambers and adjust any that are under temperature. The host could also only adjust temperature when testing is occurring, not for idle motherboards.

Alternate Embodiments

Several other embodiments are contemplated by the inventor. The local heaters could be mounted on the chassis near the test adaptor boards 50 rather than on a metal plate that holds the motherboard substrate. A fiberglass board or other insulation that better insulates the motherboard from the elevated temperatures near the test adaptor boards 50 can also be used. A local cooling gun rather than a local heater could be substituted to cool the test chamber and the memory module.

Radiant heat sources could be used rather than the resistive element. Such radiant elements could directly heat the memory module, eliminating the need for the compressed air. An air blower or pump could be used rather than a compressed air line. The valve could be integral with the heater or with the inlet line, or the valve could be located far away from the local heater, such as near the regulator. In one embodiment all the valves are located near the regulator while the resistive heating elements are mounted on the metal plates over the motherboards. Separate distribution lines connect the air flows from the valves to the local heating elements.

Using a local cooling unit rather than a resistive heating element can allow for cold-temperature testing of the memory modules. This can be useful for characterization and reliability testing.

The cover may not have to be closed over the test chamber during testing. For example, the temperature could be set to a higher setting when the cover is to be left open, allowing for some heat loss from the open test chamber.

A vented metal cover may be placed over heater 20 or over most of metal plate 64, while still leaving an opening for test chamber 10 to be reached by the robotic arm. This vented metal cover keeps waste heat from heater 20 from heating the tester.

Many kinds of memory modules can be tested. Modules using standard DRAM or newer EDO and synchronous DRAM can be tested. The system is ideally suited for testing the highest-speed memory modules, since capacitive loading is minimized. Other memories such as RAMBUS modules, DDR modules, and PC 133 synchronous modules can be tested.

Various sizes of memory in the memory module, and form factors for memory modules can be used with the invention, limited by the test adaptor board and well size. Different kinds of test adaptor boards can be substituted. The reverse-mounting of the test adaptor boards and the solder-side up arrangement of the test station allows a technician or operator to easily replace the test adaptor boards when necessary. Non-PC motherboards can also be used. The invention can be applied to any target system board. Multiple test sockets can be mounted on each test adapter board, or multiple test adapter boards may be mounted on a single motherboard, allowing multiple memory modules to be tested at the same time by the same motherboard acting as a tester.

Yamaichi type connector could be used as the test socket, but a production-quality connector/socket is preferred due to the low insertion force required. A production quality connector/socket can take more insertions (greater than 100,000 times) than conventional sockets on motherboards (rated for 100 insertions). A production socket also has an ejector normally located at the 2 edges of the socket. This alleviates the ejection of modules for manual as well as robotic handling. A production socket may also contain a V-shape groove. A handler or a robotic arm can drop the module to the V-shape entry, let it settle, and then push the module from the top to the socket. The V shape entry can lower the accuracy requirement to the handler or robotic arm for insertion of the module.

A variety of technologies can be used for the robotic arm. A swinging or pivoting arm can be used, with perhaps a telescoping arm extension and a vertical servo at the end of the arm. Alternately, an x-y-z track system can be used. Many variations of automatic tray stacker or elevator systems are known and can be employed. The test program can initially pause after insertion of a new memory module to allow it to be warmed up by the hot air. Memory modules could also be pre-heated by blowing hot air onto modules waiting to be inserted and tested. The input tray could be heated to accomplish this.

One operator may be able to operate several test stations, depending on how quickly trays need to be inserted and removed. Multiple arms can be attached to robot arm assembly 98, allowing 2 or more memory modules to be picked up and moved at the same time. The test adaptor boards can be modified to have two or more test sockets, allowing two or more modules to be tested at the same time with the same motherboard. The motherboard can then report which of the 2 modules has failed to the main system interface.

A network controller card on the ISA or PCI bus that communicates with the main system interface can be adapted for other buses and is not limited to existing buses. The controller card can be replaced by a standard parallel or serial-port interface to the main system interface. FireWire, USB, or other emerging standards can be used for the interfaces. Many kinds of robotic arms and tracking systems can be employed, with different degrees of motion. Different grasping technologies can be used to hold the memory modules in the robotic arm. Multiple robotic arms that operate in tandem or independently can be used with the test station. For example, one arm can load modules into the motherboards, while a second arm unloads tested modules.

Of course, cold air rather than hot air could be blown onto the memory module by the channel between the top plate and the metal plate. This might be useful for characterizing modules rather than for guard-band testing. Humid hot air could be used for testing hermetic seals of memory chips on the memory module, and even hot and cold air cycling could be done for reliability testing. The air may be recycled and re-blown through the channel by a blower or other air-flow system.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A parallel test system for testing memory modules at a target temperature comprising:
    a plurality of motherboards, each of the motherboards being a main board for a computer using memory modules as a memory;
    test adaptor boards, each coupled to a motherboard in the plurality of motherboards, the test adaptor boards having test sockets for receiving memory modules for testing by the motherboards, each test adaptor board for electrically connecting a memory module inserted into the test socket to a motherboard attached to the test adaptor board, the motherboard using the memory module inserted into the test socket as a portion of the memory of the motherboard;
    a plurality of local heaters, mounted near the test adaptor boards, for heating the memory modules being tested to an elevated temperature; and
    a main system interface, coupled to the plurality of motherboards, for commanding the motherboards to test memory modules inserted into the test sockets and for receiving test results from the motherboards,
    whereby the memory modules inserted into the test sockets are locally heated to an elevated temperature.

2. The parallel test system of claim 1 further comprising:
    a plurality of mounting plates, each mounting plate having a motherboard attached to a first surface and a local heater attached to a second surface, each mounting plate having an opening for the test adaptor board.

3. The parallel test system of claim 2 further comprising:
    a plurality of test chambers, each test chamber partially surrounding a test socket to allow the local heater to heat the memory module inserted into the test socket during testing,
    whereby each test chamber thermally insulates the test socket.

4. The parallel test system of claim 3 wherein each local heater comprises a resistive heating element for heating air in the test chamber.

5. The parallel test system of claim 4 wherein each local heater further comprises a thermal block, attached to the test chamber to add thermal mass to limit temperature fluctuations;
    wherein the air flow past the resistive heating element passes through the thermal block before being directed at the memory module inserted into the test socket.

6. The parallel test system of claim 4 further comprising:
    a valve for controlling an air flow past the resistive heating element.

7. The parallel test system of claim 6 wherein the valve and resistive heating element are controlled by the main system interface.

8. The parallel test system of claim 4 wherein the motherboards have a component side and a solder side, the component side having integrated circuits mounted thereon and expansion sockets for expansion boards;
    wherein the test adaptor boards are mounted to the solder side of the motherboards.

9. The parallel test system of claim 8 further comprising:

a robotic arm, responsive to commands from the main system interface, for inserting memory modules into the test sockets.

10. The parallel test system of claim 9 further comprising:

a plurality of removable covers, each removable cover for covering an opening to the test chamber during testing, but for exposing the test socket to the robotic arm after testing.

11. A memory-module tester comprising:

a robotic device that moves memory modules from an input stack of untested memory modules to an output stack of tested memory modules;

a host computer for controlling the robotic device;

a plurality of test stations for testing memory modules that are loaded and unloaded by the robotic device, each test station comprising:

a test socket mounted on a test adaptor board, the test socket for receiving a memory module inserted by the robotic device;

a motherboard for a personal computer, the motherboard executing a test program in response to commands from the host computer, the test program testing the memory module inserted into the test socket;

a mounting board for supporting the motherboard from a first surface, the mounting board having an opening to allow the robotic device to reach the test socket from a second surface opposite the first surface of the mounting board; and a heating device, mounted on the first surface of the mounting board, for heating the memory module inserted into the test socket;

wherein the mounting board thermally isolates the motherboard from the heating device, whereby memory modules tested by the motherboards are heated by the heating device on the mounting board while the motherboards are thermally isolated.

12. The memory-module tester of claim 11 further comprising:

a regulator, coupled to a compressed-air supply line, for regulating an air flow;

a distribution line for distributing an air flow to the heating devices in the plurality of test stations;

wherein at each test station a portion of the air flow from the distribution line passes the heating device and is heated before being blown onto the memory module inserted into the test socket, whereby the memory modules are heated by a locally-heated hot air flow.

13. A multiple-motherboard temperature-controlled memory tester comprising:

main system means for controlling testing of memory modules on multiple motherboards;

motherboard means, controlled by the main system means, for executing a test program on a memory module inserted into a test socket means;

test adaptor board means, mounted on the motherboard means, for electrically connecting the test socket means to a memory bus means on the motherboard;

local temperature means, near each the test adaptor board means, for establishing and maintaining the memory module inserted into the test socket means at a target test temperature while the motherboard means executes the test program on the memory module inserted into the test socket means;

wherein the multiple-motherboard temperature-controlled memory tester has a plurality of the motherboard means, each motherboard means having an attached test adaptor board means with a test socket means and a local temperature means, each motherboard means for executing the test program on a different memory module in parallel with other motherboard means, whereby parallel testing of memory modules at the target test temperature is performed.

14. The multiple-motherboard temperature-controlled memory tester of claim 13 further comprising:

robotic means, controlled by the main system means, for grasping a memory module and inserting the memory module into the test socket means, the robotic means also for grasping and removing the memory module from the test socket means after completion of the test program, and moving the memory module to an output means for storing tested memory modules when the motherboard means indicates to the main system means that the memory module has passed the test program, whereby the memory modules are moved by the robotic means.

15. The multiple-motherboard temperature-controlled memory tester of claim 14 wherein the local temperature means comprises:

air inlet means for receiving an air flow;

local heater means, coupled to the air inlet means, for heating the air flow;

directional means, coupled to the local heater means, for directing the air flow after heating to the memory module inserted into the test socket means.

16. The multiple-motherboard temperature-controlled memory tester of claim 15 wherein the local temperature means further comprises:

valve means, coupled to the air inlet means, for controlling the air flow through the local heater means.

17. The multiple-motherboard temperature-controlled memory tester of claim 16 wherein the local temperature means further comprises:

temperature sensing means for sensing a temperature near the test socket means;

wherein the main system means includes program means for reading the temperature sensed by the temperature sensing means, and for controlling the local heater means to adjust the temperature to the target test temperature, whereby temperature of each test socket means is controlled by the main system means.

18. The multiple-motherboard temperature-controlled memory tester of claim 17 further comprising:

cooling means, isolated from the local temperature means, for cooling the motherboard means, whereby motherboards are cooled but memory modules are heated.

19. The multiple-motherboard temperature-controlled memory tester of claim 18 further comprising:

wall means for thermally isolating the test socket means;

cover means, controlled by the program means, for covering an opening of the wall means during testing, but for exposing the opening after testing to allow the robotic means to remove the memory module inserted into the test socket means, whereby the test socket means is thermally isolated and an opening for the robotic means is covered during testing.

20. The multiple-motherboard temperature-controlled memory tester of claim 13 wherein the local temperature means is mounted onto a first surface of a plate while the motherboard means is mounted to a second surface of the plate.

* * * * *